US007713778B2

(12) United States Patent
Li et al.

(10) Patent No.: US 7,713,778 B2
(45) Date of Patent: May 11, 2010

(54) NANOSTRUCTURED CASTING OF ORGANIC AND BIO-POLYMERS IN POROUS SILICON TEMPLATES

(76) Inventors: Yang Yang Li, 420 Santa Barbara, Irvine, CA (US) 92606; Frederique Cunin, 315 Avenue Saint Maurice, 34250 Palavas les Flots (FR); Michael J. Sailor, 3303 Caminito E. Bliff, #178, La Jolla, CA (US) 92037; Jamie R. Link, 900 N. Randolph St., Apt. 507, Arlington, VA (US) 22203; Ting Gao, 1063 Morse Ave., Apt. 15-308, Sunnyvale, CA (US) 94089

( * ) Notice: Subject to any disclaimer, the term of this patent is extended or adjusted under 35 U.S.C. 154(b) by 1001 days.

(21) Appl. No.: 10/544,801

(22) PCT Filed: Feb. 13, 2004

(86) PCT No.: PCT/US2004/004320

§ 371 (c)(1),
(2), (4) Date: Jan. 11, 2006

(87) PCT Pub. No.: WO2004/071949

PCT Pub. Date: Aug. 26, 2004

(65) Prior Publication Data

US 2006/0236436 A1  Oct. 19, 2006

Related U.S. Application Data

(60) Provisional application No. 60/447,228, filed on Feb. 13, 2003.

(51) Int. Cl.
 *H01L 21/00* (2006.01)
(52) U.S. Cl. ............................ 438/99; 977/921; 438/753

(58) Field of Classification Search .................. 438/99, 438/478, 700, 745, 753; 977/721, 778, 773
See application file for complete search history.

(56) References Cited

U.S. PATENT DOCUMENTS

| 5,318,676 | A  | * | 6/1994  | Sailor et al. .................. 205/655 |
| 6,806,543 | B2 | * | 10/2004 | Yamakawa et al. .......... 257/414 |
| 6,970,239 | B2 | * | 11/2005 | Chan et al. .................... 356/301 |
| 7,001,669 | B2 | * | 2/2006  | Lu et al. ....................... 428/613 |
| 7,042,570 | B2 | * | 5/2006  | Sailor et al. .................. 356/445 |
| 7,094,464 | B2 | * | 8/2006  | Mao et al. ................. 428/319.3 |
| 2001/0044119 | A1 | * | 11/2001 | Ghadiri et al. ............... 435/7.1 |

(Continued)

OTHER PUBLICATIONS

Thönissen, M. & Berger, M.G., "Multilayer Structures of Porous Silicon", Properties of Porous Silicon, vol. 18. (ed. L. Canham), pp. 30-37 (Short Run Pres Ltd., London; 1997).

(Continued)

*Primary Examiner*—Savitri Mulpuri
(74) *Attorney, Agent, or Firm*—Greer, Burns & Crain Ltd.

(57) ABSTRACT

A method of generating three-dimensional nanostructures that includes providing a silicon substrate, creating a porous silicon template from the silicon substrate, wherein the template is created to have a predetermined configuration, depositing a predetermined material on the porous silicon template, and removing the porous silicon template from the deposited material to leave a freestanding nanostructure.

30 Claims, 4 Drawing Sheets

U.S. PATENT DOCUMENTS

| | | | | |
|---|---|---|---|---|
| 2002/0072116 | A1* | 6/2002 | Bhatia et al. | 435/366 |
| 2002/0104762 | A1 | 8/2002 | Stonas et al. | 205/118 |
| 2002/0132101 | A1* | 9/2002 | Fonash et al. | 428/304.4 |
| 2002/0167118 | A1* | 11/2002 | Billiet et al. | 264/432 |
| 2003/0089899 | A1* | 5/2003 | Lieber et al. | 257/9 |
| 2004/0053422 | A1* | 3/2004 | Chan et al. | 436/180 |
| 2005/0042764 | A1* | 2/2005 | Sailor et al. | 436/166 |
| 2005/0058416 | A1* | 3/2005 | Hoon Lee et al. | 385/122 |
| 2005/0266045 | A1* | 12/2005 | Canham et al. | 424/423 |
| 2006/0096922 | A1* | 5/2006 | Gin et al. | 210/650 |
| 2006/0105043 | A1* | 5/2006 | Sailor | 424/484 |
| 2006/0215154 | A1* | 9/2006 | Chan et al. | 356/244 |

OTHER PUBLICATIONS

Halimaoui, A., "Porous Silicon Formation by Anodisation", Properties of Porous Silicon, vol. 18, (ed L. Canham), pp. 12-22 (Short Run Press Ltd., London; 1997).

Bellet, D., "Drying of Porous Silicon", Properties of Porous Silicon, vol. 18. (ed. L. Canham) pp. 38-43 (Short Run Pres Ltd., London; 1997).

Canham, L.T., "Storage of Porous Silicon", Properties of Porous Silicon, vol. 18. (ed. L. Canham) pp. 44-50 (Short Run Pres Ltd., London; 1997).

Loni, A., "Capping of Porous Silicon", Properties of Porous Silicon, vol. 18. (ed. L. Canham) pp. 51-58 (Short Run Pres Ltd., London; 1997).

Allongue, P. "Porous Silicon Formation Mechanisms", Properties of Porous Silicon, vol. 18, (ed L. Canham), pp. 3-11 (Short Run Press Ltd., London; 1997).

Coffer, J.L., "Porous Silicon Formation by Stain Etching", Properties of Porous Silicon, vol. 18, (ed L. Canham), pp. 23-29 (Short Run Press Ltd., London; 1997).

Berger, M.G. et al. Dielectric Filters made of porous silicon: advanced performance by oxidation and new layer structures. *Thin Sol. Films* 297, 237-240 (1997).

Cazzanelli M., Vinegoni, C. & Pavesi, L. Temperature dependence of the photoluminescence of all-porous-silicon optical microcavities, *J. Appl. Phys.* 85, 1760-1764 (1999).

Lehmann, V., Stengl, R., Reisinger, H., Detemple, R. & Theiss, W. Optical shortpass filters based on macroporous silicon. *Appl. Phys. Lett.* 78, 589-591 (2001>.

Mazzoleni, C. & Pavesi, L. Application to optical components of dielectric porous silicon multilayers. *Appl. Phys. Lett.* 67, 2983-2985 (1995).

Pavesi, L. & Dubos, P. Random porous silicon multilayers: application to distributed Bragg reflectors and interferential Fabry-Perot filters. *Semicon. Sci. Tech.* 12, 570-575 (1997).

Pellegrini, V., Tredicucci, A., Mazzoleni, C. & Pavesi, L. Enhanced optical properties in porous silicon microcavities, *Phys. Rev. B (Condens. Matt.)* 52, R14328-14331 (1995).

Snow, P.A., Squire, E.K., Russell, P.S.J. & Canham, L.T. Vapor sensing using the optical properties of porous silicon Bragg mirrors. *J. Appl. Phys.* 86, 1781-1784 (1999).

Vincent, G. Optical properties of porous silicon superlattices, *App. Phys. Lett.* 64, 2367-2369 (1994).

Zangooie, S., Schubert, M., Trimble, C., Thompson, D.W. & Woollam, J.A. Infrared ellipsometry characterization of porous silicon Bragg reflectors. *Appl. Optics* 40, 906-912 (2001).

Zangooie, S., Bjorklund, R. & Arwin, H. Vapor sensitivity of thin porous silicon layers. *Sens. Actuators B* 43, 168-174 (1997).

Gao, J., Gao, T., Li, Y. & Sailor, M.J. Vapor Sensors Based on Optical Interferometry from Oxidized Mircoporous Silicon Films, *Langmuir* 18, 2229-2233 (2002).

Letant, S.E., Content S., Tan, T.T., Zenhausern, F. & Sailor, M.J. Integration of Porous Silicon Chips in an Electronic Artificial Nose. *Sens. Actuators B* 69, 193-198 (2000).

Gao, J., Gao., T. & Sailor, M.J. A porous silicon vapor sensor based on laser interferometry. *Appl. Phys. Lett.* 77, 901-903 (2000).

Allcock, P. & Snow, P.A. Time-resolved sensing of organic vapors in low modulating porous silicon dielectric mirrors. *J. Appl. Phys.* 90, 5052-5057 (2001).

\* cited by examiner

NANOSTRUCTURED CASTING OF ORGANIC AND BIO-POLYMERS IN POROUS SILICON TEMPLATES

PRIORITY CLAIM

Applicants claim priority benefits under 35 U.S.C. §119 on the basis of Patent Application No. 60/447,228, filed Feb. 13, 2003 and Application No. PCT/US2004/004320, filed Feb. 13, 2004.

STATEMENT OF GOVERNMENT INTEREST

This invention was made with Government support under Grant Number DMR-97-00202 awarded by the National Science Foundation, and Grant Number F49620-02-1-0288 awarded by the Air Force Office of Scientific Research. The Government has certain rights in the invention.

TECHNICAL FIELD

A field of the invention is nanostructure synthesis. Other fields of the invention include chemical sensors, biological sensors, bioimplant materials, optical switching devices, information displays (CRT, LCD displays), physically deformable structures, optical filters, self-reporting bioresorbable materials, photonic crystals, and dielectric mirrors.

BACKGROUND ART

Synthesis of materials using nanostructured templates has emerged as a useful and versatile technique to generate ordered nanostructures. Conventionally, templates consisting of materials such as microporous membranes, zeolites, and crystalline colloidal arrays have been used to construct elaborate electronic, mechanical or optical structures. However, these templates are not amenable to precise and accurate patterning techniques, limiting their respective applications as templates. In addition, to the inventors' knowledge, there is no general, rapid method to construct designed, complicated optical filters such as one-dimensional photonic crystals from common engineering materials such as plastics, polymers, or resins. Most methods used to prepare optical filters such as dielectric stacks rely on lamination or vapor deposition routes, and the complexity of the process increases with the complexity of the desired optical filter characteristics. Self-assembly routes, such as the spontaneous ordering that occurs when colloidal beads are allowed to pack tightly together, do not allow the design of an optical structure with arbitrarily chosen spectral features. Moreover, while silicon, porous silicon, $SiO_2$ and alumina-based materials are readily configured according to precise specifications, the chemical and mechanical stability of porous silicon, $SiO_2$ and alumina for a variety of applications has historically presented a significant problem.

DISCLOSURE OF INVENTION

The instant invention includes method of generating three-dimensional nanostructures using porous silicon or $SiO_2$ as a template. The method generally includes providing a silicon substrate, creating a porous template from the silicon (or after thermal oxidation, $SiO_2$) substrate wherein the template has a predetermined configuration, then depositing a predetermined material in the porous template. The porous template can be removed to provide a freestanding nanostructure, or it can be left in place, yielding a composite nanostructure.

BEST MODE FOR CARRYING OUT THE INVENTION

Figure 1:
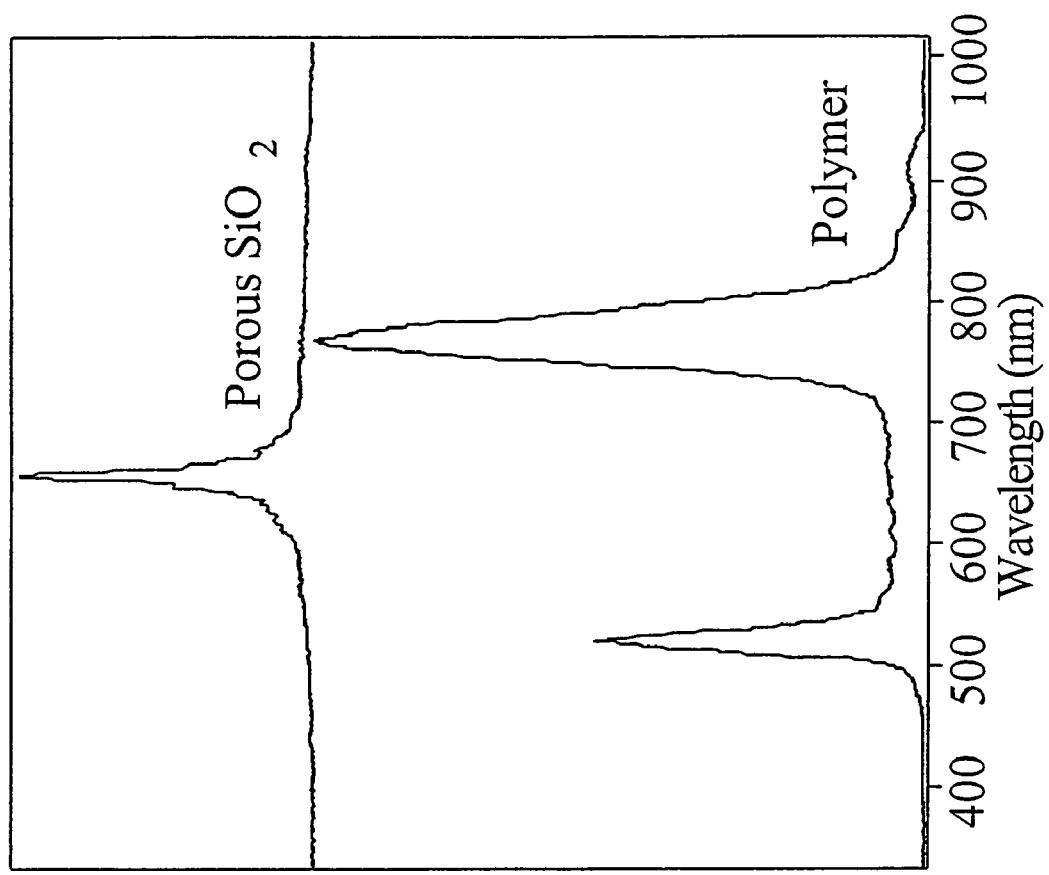
FIG. 1 is a graph illustrating reflectivity spectra of an oxidized porous Si rugate filter film (top) and a polystyrene film cast from the porous Si template (bottom)

The instant invention includes the use of porous Si or porous $SiO_2$ as a template, but permits a boundless number of materials to be cast therein and thereon, thereby exploiting the advantages of silicon as a template while using a host of other materials for the desired nanostructure, preferably materials optimized for use with an intended application. More specifically, the instant invention includes the manufacture and use of porous silicon and porous $SiO_2$ as a template for generating nanostructures having predetermined configurations, thus exploiting the versatility of patterning available to silicon while not restricting the composition of the resulting nanostructures to silicon.

Embodiments of the instant invention include the manufacture and use of porous silicon and porous $SiO_2$ templates having a predetermined configuration that is specific to the particular nanostructure to be generated. Porous silicon and porous $SiO_2$ are particularly advantageous as templates because the porosity and average pore size can be readily tuned by adjustment of the electrochemical preparation conditions. However, the chemical and mechanical stability of porous silicon and $SiO_2$ for biological and environmental sensor applications has historically presented a significant problem. For example, porous Si or porous $SiO_2$ are brittle solids that can easily crack when subjected to thermal or mechanical stresses. Generally, the instant invention provides for a porous template composed of silicon or $SiO_2$, into which is deposited a predetermined material. If the template is subsequently removed, a freestanding nanostructure having a structure approximating the inverse of the now removed template results. If the template is not removed, the composite material possesses much improved mechanical and chemical stability.

Therefore, embodiments of the instant invention are directed to a method of use of porous Si and porous $SiO_2$ as templates, thereby capable of being precisely tuned to have a predetermined configuration and porosity, into which a separate material is subsequently desposited to create a nanostructure having the predetermined configuration and porosity of the porous Si template, and that is compatible with biological systems or harsh environments. In addition to generating 3-D nanostructures, porous silicon and porous $SiO_2$ templates are capable of generating 1-, 2- and 3-dimensional photonic crystals, dielectric mirrors, microcavities, and other optical structures.

Thus, embodiments of the instant invention include the templating of solution-cast and injection molded thermoplastic organic polymers, inorganic polymers, biopolymers, inorganic oxides, and molecular organic compounds in porous Si or porous $SiO_2$ multilayer structures, thereby transferring the optical properties and nanostructure of the porous Si or $SiO_2$, to alternative materials. Elaborate 1-D photonic crystals may be generated from a variety of solution- or melt-processible organic compounds, organic polymers, inorganic polymers, inorganic compounds, and biopolymers by templating of the solution-cast or injection-molded materials in porous silicon or porous $SiO_2$ multilayers or other complex nanostructures.

Melt processing involves materials whose viscosity decreases dramatically with temperature, such that at a certain temperature the material becomes liquid and can flow into the porous template. At a certain lower temperature the material solidifies, at which point it can be removed from the porous template and still retain the micro- or nanostructure of the template. Solution processing involves dissolving the solid material in a solvent and infusion of the solution into the porous template. The solid residue remaining after evaporation of the solvent fills the voids of the porous template. After removal of the template by chemical dissolution, the polymer or molecular castings replicate the photonic features of the silicon or $SiO_2$ template. Use of the castings as vapor sensors, deformable and tunable optical filters, and as self-reporting bioresorbable materials is then possible.

The castings created in the silicon or $SiO_2$ template thus retain the photonic structure of the template. The castings may then be used for any number of applications, such as vapor sensors, chemical sensors biological sensors deformable and tunable optical filters, self-reporting, bioresorbable drug delivery materials, bioimplant materials, optical switching devices, and information displays (CRT, LCD displays), photonic crystals, dielectric mirrors, microcavities, and other optical structures.

Embodiments of the instant invention further provide for construction of simple and very complex photonic structures from virtually any plastic, polymer, biopolymer, organic, or inorganic material using a pre-formed, nanostructured template and solution casting or melt-processing techniques. Similar structures are typically made by thermal evaporation or molecular beam deposition techniques, and the resultant castings do not have porous nanostructures. Obtaining porous structures is desirable because porous structures may be used as sensors, for drug delivery, or physically deformable materials. In addition, the ability to tune the optical properties of porous Si by current-modulated electrochemical etch is well-established, and it provides a convenient route into templates whose nanostructure can be precisely controlled. This technique thus provides a route into materials with complicated optical and nanoscale features that cannot be made by any other route.

In one embodiment, porous silicon templates were prepared by a galvanostatic anodic etch of crystalline silicon wafers. The electrochemical process generates an optically uniform porous silicon layer, where the thickness and porosity of a given layer is controlled by the current density, duration of the etch cycle, and etchant solution composition. The photonic structures approximating rugate filters were prepared by applying a computer-generated pseudo-sinusoidal current waveform to the etch cell. This results in a porous nanostructure whose porosity varies with depth in a sinusoidal fashion. The direct mapping of pore size and porosity to current density is a key aspect of the template design. Although a sinusoidal waveform generates a rugate filter, the principle holds for any arbitrary waveform; the arbitrary current-time waveform maps to a porosity-depth profile in the template.

The resulting porous silicon multilayers were used as templates for the solution-casting of thermoplastic polymers, such as polystyrene. Thermoplastics are commonly used in injection-molding processes, and a large variety of polymers with useful mechanical, electronic, or optical properties are available. Following deposition of the thermoplastic polymer, the porous silicon template was removed by oxidative dissolution using a basic solution, such as an aqueous (1 M) KOH solution or NaOH solution. Removal of the porous silicon template from the polymer or biopolymer imprint by chemical dissolution provides a freestanding porous polymer film with the optical characteristics of the photonic crystal template. The resulting nanostructure is retained in the casting even after removal of the silicon template.

Nanostructured $Sio_2$ can also be used as a template. In this case the porous Si template is first oxidized by thermal oxidation (oven in air or $O_2$ at temperature >150 deg C.) and then subjected to the casting process. The advantage of this approach over use of porous Si directly is that the $SiO_2$ template can be dissolved in aqueous hydrofluoric acid. For some applications the organic, bio, or inorganic templated materials may not be stable in the basic solutions needed to dissolve the porous Si templates.

Experimental data confirm that the casting retains the microstructure and the nanostructure of the silicon template. For example, as illustrated in FIG. 1, when using a template preconfigured to have a sinusoidally varying porosity gradient (i.e., a pseudo-rugate filter), comparison of the white light reflection spectra of the porous Si template and the polystyrene casting made therefrom demonstrate that both the template and the casting similarly exhibit the refractive index gradient of the pseudo-rugate filter. In FIG. 1, the spectral peaks correspond to the second order diffraction peak of the template and the second and third order diffraction peak of the imprint. The porous template was etched using a sinusoidal current varying between 38.5 and 192.3 $mA/cm^2$, with 70 repeats and a periodicity of 8 seconds. The total thickness of the porous silicon film was 40 µm. The reflected light spectra were obtained using an Ocean Optics SD2000 CCD spectrometer using tungsten light illumination. Spectra are offset along the y-axis for clarity. Thus, in this manner, the nanostructure has retained the structure of the silicon template, even after the silicon template has been removed.

Figure 2:
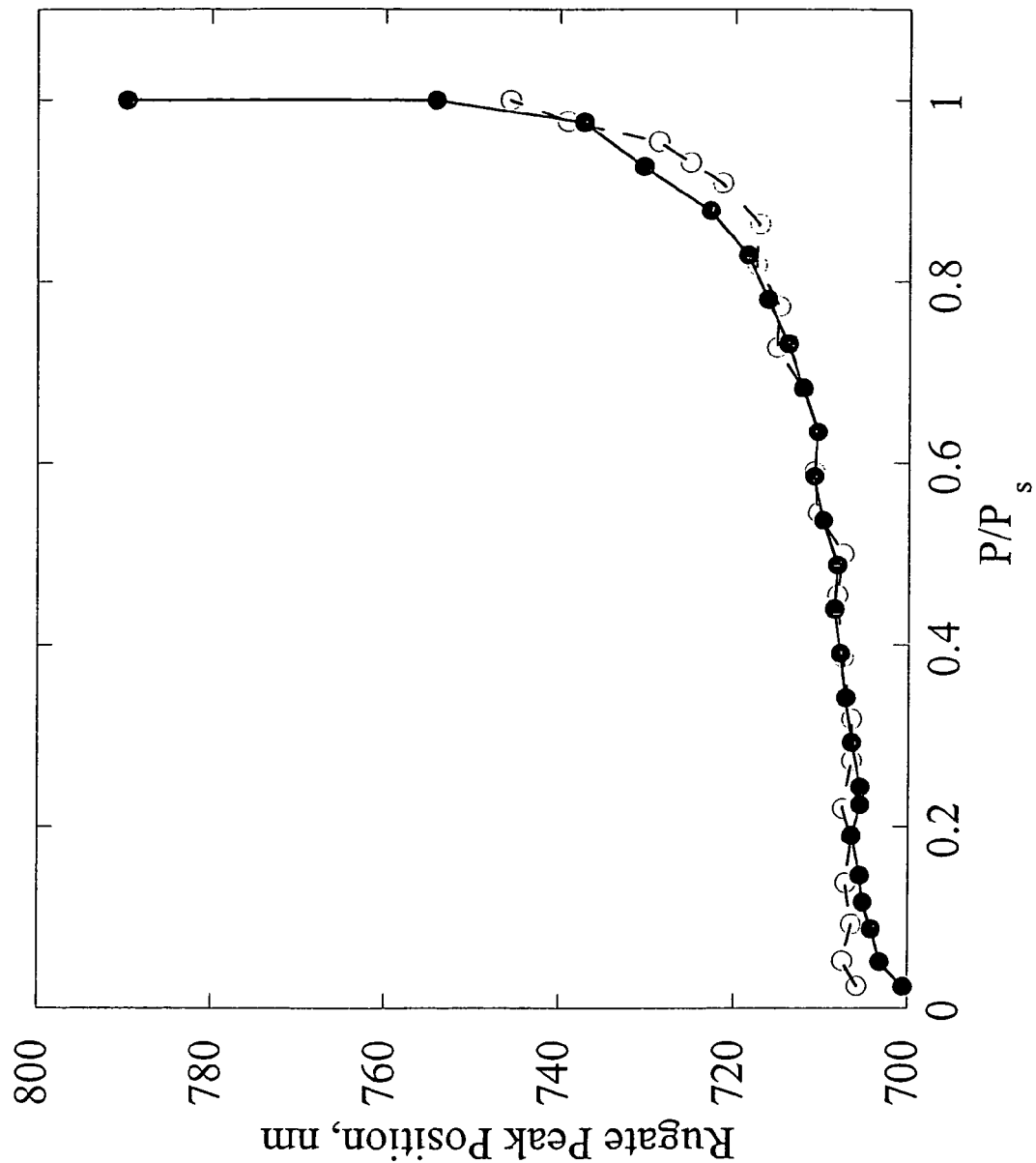
FIG. 2 is a graph illustrating dose/response curves for a porous Si rugate filter film template (solid circles, solid line) and its replicate polystyrene film (open circles, dashed line) upon exposure to ethanol vapor.

Additional experimental data demonstrate the fidelity of the microporous nanostructure resulting from the solution-casting of the thermoplastic polymer. Vapor dosing experiments may be performed and, as illustrated in FIG. 2, a dose-response curve for ethanol vapor in nitrogen gas may be observed and compared for both the porous silicon template and the thermoplastic polymer cast therein. The data presented as the wavelength of the second order peak maximum from the Rugate structure as a function of $P/P_s$, where P is the partial pressure of ethanol and $P_s$ is the saturation vapor pressure of ethanol (44 Torr). The samples were prepared similarly to those whose spectra are presented in FIG. 1. Imprints prepared from melt-cast polyethylene display the optical spectrum characteristic of the Rugate structure, but they show no spectral shift upon exposure to ethanol vapor.

More specifically, the position of the spectral feature for a Rugate filter strongly depends on the periodicity and refractive index gradient of the structure. For a porous Rugate, the refractive index of the material is readily perturbed by adsorption and capillary condensation of vapors. Thus when porous silicon multilayers are exposed to condensable vapors such as ethanol or hexane, microcapillary condensation produces an increase in refractive index and a spectral red shift of the photonic structure. The shift of the spectrum upon analyte adsorption has been correlated with the concentration of analyte in the gas stream, and this phenomenon has been used as a very sensitive (ppb range) vapor sensor. The templated polymeric photonic crystals also display the microcapillary condensation phenomenon.

Thus, turning now to FIG. 2, the large relative response at pressures of the vapor within a few percent of saturation is characteristic of capillary condensation effects. As discussed, the chemical and mechanical stability of porous Si for biological and environmental sensor applications has historically presented problems. However, because the castings have the chemical and mechanical properties of the polymers used, embodiments of the instant invention provide a significant improvement in the design of experiments and devices that incorporate nanostructured photonic materials, while retaining the simplicity of fabrication inherent in the electrochemical synthesis of porous Si.

Another embodiment of the instant invention includes generation and use of castings made from flexible polymers, such as polydimethylsiloxane or a polydimethylsiloxane precursor, to provide mechanically deformable filters. These deformable castings could be useful for optical communications, optical switching, information displays, and information storage and retrieval, robust tags for bio-screening, and pressure sensors. The flexible polymers may be deposited into a silicon template via a plurality of methods, such as by casting of the flexible polymer from a solution, depositing of the flexible polymer from the vapor phase, or injection molding of the flexible polymer. Deformation of the cast material by application of either a tensile or a compressive stress produces a spectral shift in the photonic feature. For example, using polydimethylsiloxane, the spectrum shifted by as much as 10 nm by application of moderate pressures. This embodiment is advantageous in that rapidly tunable filters are highly desirable for optical switching and display applications. This embodiment yields a simple and robust means of manufacturing such devices that is compatible with conventional Si microfabrication technologies.

Still other embodiments of the instant invention may be used to generate biocompatible and bioresorbable polymers, which are of great interest for their use in prosthesis, medical suture, tissue engineering, and drug delivery systems. Preferably, a liquid or gas phase precursor to an inorganic or organic polymer, amorphous solid, or crystalline solid is cast into the template via infusion. More specifically, while numerous biocompatible and bioresorbable polymers may be used, polylactic acid, Polylactide-co-glycolide, polydimethylsiloxane, and polymethyl methacrylate are exemplary candidates.

For example, one of the deformable polymers could be implanted in an artificial hip joint and used to measure pressure or strain on the joint. It could be used similarly in other structural materials for mechanical or civil engineering applications wherein the strain would be measured by using an optical spectrometer or similar device to read out the wavelength of the photonic feature in the imprinted polymer. Biodegradable polyesters, such as for example poly(lactide) or poly(lactic acid), and Polylactide-co-glycolide, are the most widely studied and employed polymers for application in the controlled release of drugs.

Figure 3:
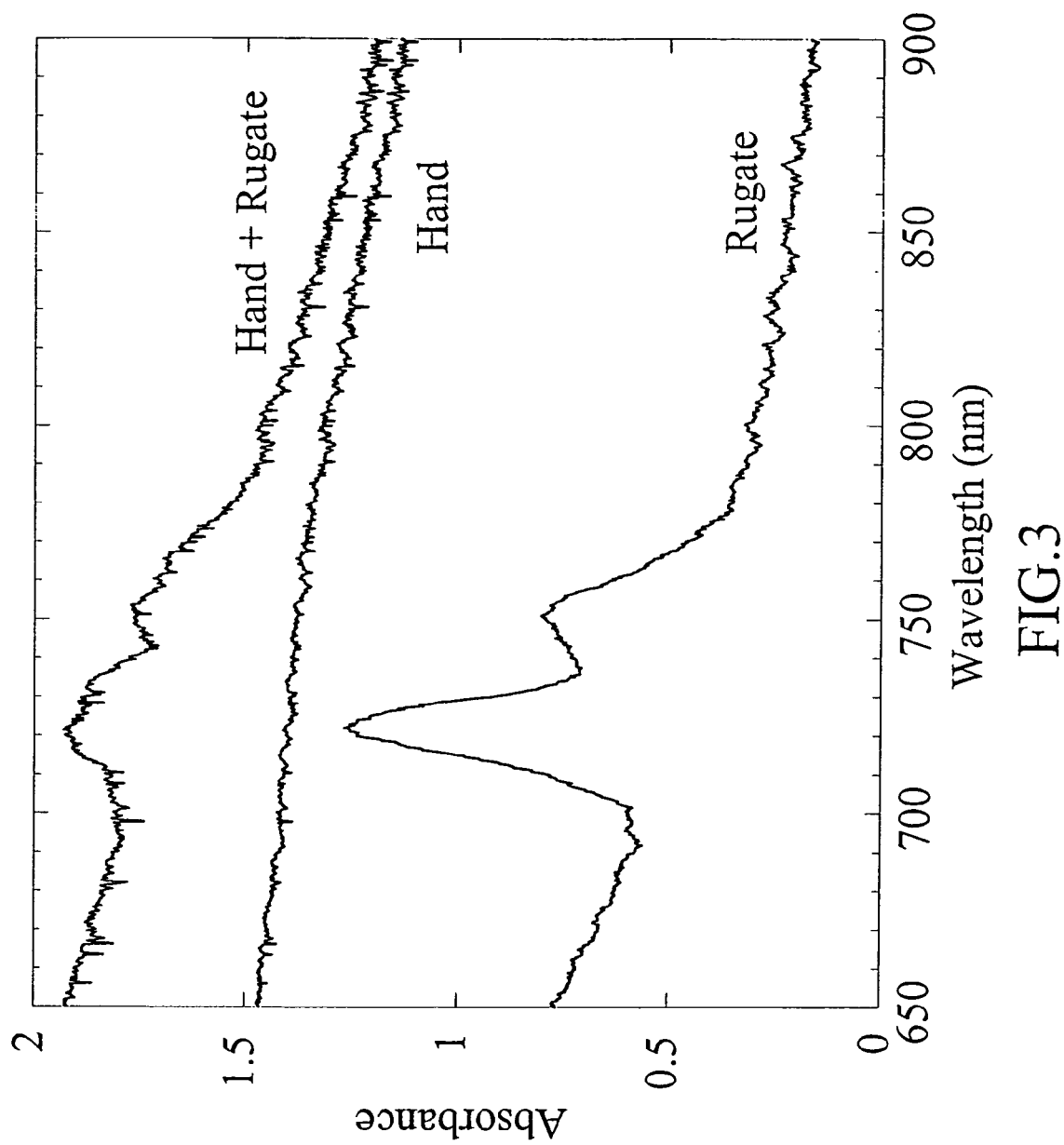
FIG. 3 is a graph illustrating an absorption spectrum (transmission mode) of a porous Si rugate filter (bottom, "Rugate"), 1 mm of human hand tissue ("hand"), and the porous Si rugate filter measured through 1 mm of human hand tissue ("rugate+hand")

In some cases, there is a desire to monitor the status of the biomaterial in vivo. Because the spectral reflectance peaks of the porous Si filters and their polymer castings can be tuned over a wide range (at least 400-10,000 nm), the peaks can be placed at wavelengths corresponding to a region of relatively low absorption in human tissue. As illustrated in FIG. 3, the spectrum of a porous Si photonic structure that exhibits two resonances, obtained through 1 mm of soft tissue of a human hand demonstrates that such measurements could be obtained in vivo. FIG. 3 demonstrates the ability to monitor the spectral signature of the nanostructured materials in vivo. The spectral "hand" and "Rugate+hand" are offset along the y-axis by +0.8 absorbance units for clarity. Measurement of the decay in intensity of the Rugate peak could thus be used to monitor, for example, the release of drug from an implanted biocompatible polymer.

By way of example only, medications such as chronic pain medications, cancer therapeutics, drugs for treatment of macular degeneration, birth control medication, and many others could be infused in the material to be implanted in the body. As the drug is released, medical personnel or others could monitor the release characteristics and residual life of the fixture. Monitoring of the fixture could be achieved by various methods, such as illuminating the fixture with near infrared, tissue penetrating light and a spectrometer placed on the surface of the skin close to the implant could receive the reflected or transmitted light from the fixture. Since the spectrum of the fixture indicates the amount of drug loaded, the system would provide a non-invasive means of monitoring drug release. In this manner, the optical signature of the implant or other drug delivery system can be tuned into the relatively transparent wavelength window of human tissue, and can been perceived in vivo. As the drug is released, the optical signature will change. By monitoring the change of the optical features one can monitor the drug delivery process.

Figure 4:
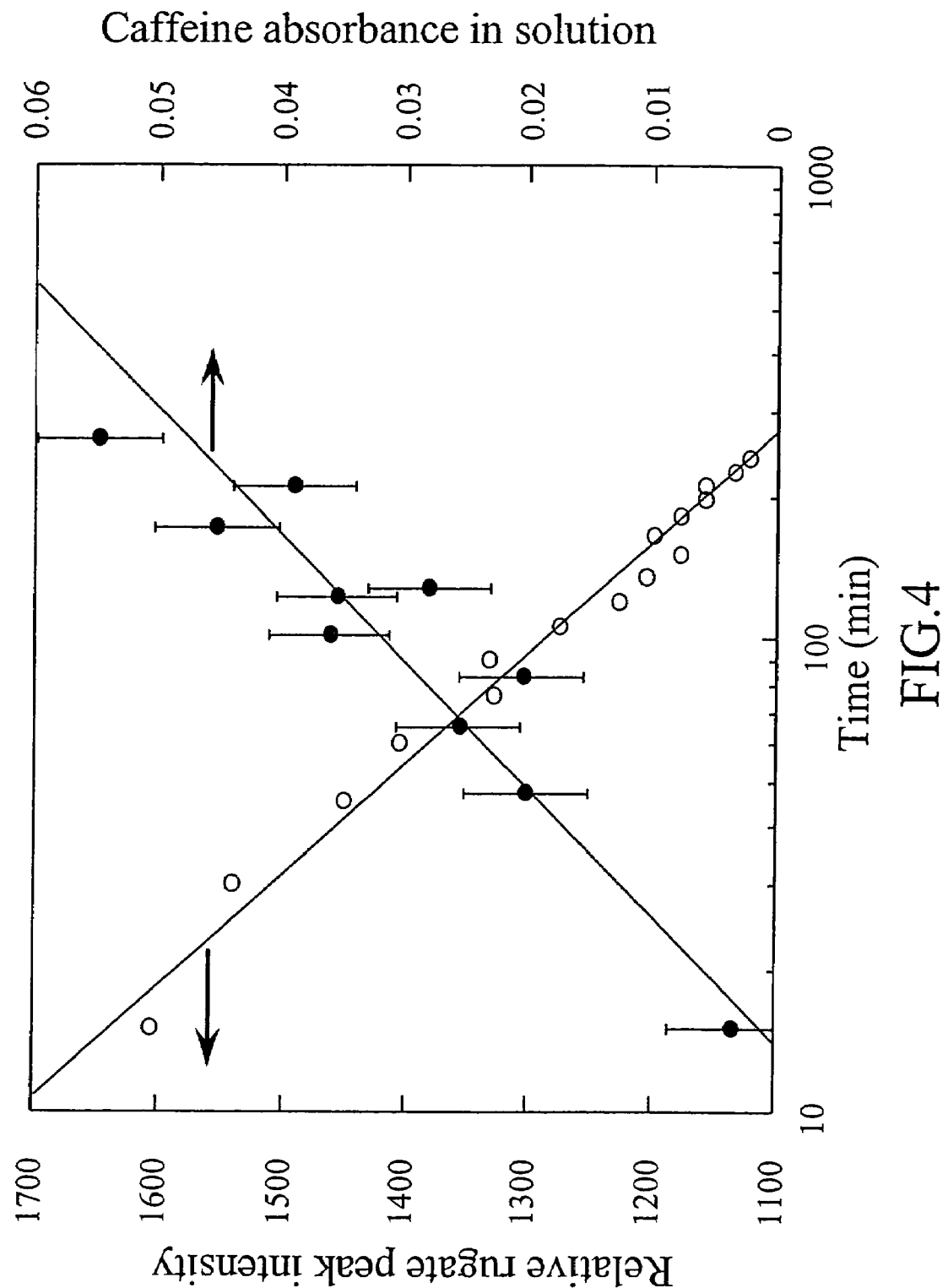
FIG. 4 is a graph illustrating an intensity of reflected light from a polymer rugate structure measured at 533 nm (open circles) and UV absorbance of free caffeine in solution measured at 274 nm (solid circles) as a function of time for a caffeine-impregnated poly(L-lactide) (PL) casting immersed in aqueous solution (buffered at pH=10).

Turning now to FIG. 4, for example, a caffeine-impregnated poly(L-lactide)(PL) film may be cast from a thermally oxidized porous silicon rugate template. Replication of the optical spectrum is observed in the biocompatible polymer upon removal of the porous silicon template. The photonic structure in the film is completely degraded in approximately five days in a pH 10 aqueous buffer solution. The intensity of the Rugate peak displays an exponential decay over the first three days, reflecting the progressive hydrolysis of the biopolymer in the aqueous environment. Simultaneous measurement of the decay of the Rugate peak and the appearance of caffeine in the solution (caffeine absorption feature at 274 nm) confirms that the drug is released on a timescale comparable to polymer degradation.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the following claims.

What is claimed is:

1. A method of generating three-dimensional nanostructures comprising:
   providing a silicon substrate;
   creating a porous silicon template from the silicon substrate, said template being created to have a predetermined configuration by a current-modulated electrochemical etching process that is controlled by a predetermined waveform to map a predetermined porosity-depth profile in the porous silicon template;

depositing a predetermined material into the porous silicon template; and
removing the porous silicon template from the deposited material to leave a freestanding nanostructure.

2. The method recited in claim 1 wherein creating the porous silicon template comprises galvanostatic anodic etching of crystalline silicon wafers.

3. The method recited in claim 2 wherein said predetermined waveform comprises pseudo-sinusoidal current-time waveform.

4. The method of claim 1 wherein creating porous silicon template comprises thermally oxidizing the silicon template to become $SiO_2$.

5. The method of claim 1 wherein configuring of the porous silicon template comprises applying a predetermined current density.

6. The method of claim 1 wherein configuring of the porous silicon template comprises exposing the silicon template to an etch cycle for a predetermined time duration.

7. The method of claim 1 wherein configuring of the porous silicon template comprises exposing the silicon template to an etchant solution having a predetermined composition.

8. The method of claim 1 wherein depositing the material comprises solution casting of the predetermined material into the porous silicon template.

9. The method of claim 1 wherein depositing the material comprises melt processing of the predetermined material into the porous silicon template.

10. The method of claim 1 wherein depositing the material comprises injection molding of the predetermined material into the porous silicon template.

11. The method of claim 1 further comprising selecting the predetermined material to be one of the group consisting of a plastic, a polymer, a biopolymer, an organic material and an inorganic material.

12. The method of claim 1 wherein removing of the silicon template comprises either a basic or an oxidative dissolution.

13. A method of generating a freestanding porous polymer film having optical characteristics of a template into which it is cast comprising:
providing a silicon wafer;
etching the silicon wafer to form a porous template having a predetermined configuration by a current-modulated electrochemical etching process that is controlled by a predeterminded waveform to map a predeterminded porosity-depth profile in the porous silicon template;
solution casting a thermoplastic polymer into the template; and
dissolving the template to obtain the freestanding porous polymer film.

14. The method of claim 13 wherein said porous template is etched to have a predetermined configuration approximating that of a Rugate filter.

15. The method of claim 13 wherein polystyrene is solution cast into the template.

16. A method of generating a freestanding mechanically deformable filter comprising:
providing a silicon wafer;
etching the silicon wafer to form a porous template having a predetermined configuration by a current-modulated electrochemical etching process that is controlled by predetermined waveform to map a predetermined porosity-depth profile in the porous silicon template;
depositing a flexible polymer into the template; and
dissolving the template to obtain the freestanding mechanically deformable filter.

17. The method of claim 16 wherein depositing the flexible polymer comprises casting the polymer from solution.

18. The method of claim 16 wherein depositing the flexible polymer comprises depositing the flexible polymer from a vapor phase.

19. The method of claim 16 wherein depositing of the flexible polymer comprises injection molding of the flexible polymer.

20. The method of claim 16 wherein said porous template is etched to have a predetermined configuration approximating that of a rugate filter.

21. The method of claim 16 wherein polydimethylsiloxane is cast from solution into the template.

22. The method of claim 16 wherein polydimethylsiloxane is infused into the template.

23. The method of claim 16 wherein a polydimethylsiloxane precursor is cast from solution into the template.

24. A method of generating biocompatible, bioresorbable polymer nanostructures comprising:
providing a silicon wafer;
etching the silicon wafer to form a porous template having a predetermined configuration by a current-modulated electrochemical etching process that is controlled by a predetermined waveform to map a predetermined porosity-depth profile in the porous silicon template;
infusing a predetermined material into the template; and
dissolving the template to obtain the polymer nanostructure.

25. The method of claim 24 wherein a liquid phase precursor to either an inorganic polymer or an organic polymer is infused into the template.

26. The method of claim 24 wherein a gas phase precursor to either an inorganic polymer or an organic polymer is infused into the template.

27. The method of claim 24 wherein an amorphous solid is infused into the template.

28. The method of claim 24 wherein a crystalline solid is infused into the template.

29. The method of claim 24 wherein the predetermined material infused into the template is selected from the group consisting of polylactic acid, Polylactide-co-glycolide, polydimethylsiloxane, and polymethyl methacrylate.

30. A method for generating biodegradable nanostructures for controlled drug delivery system comprising:
providing a silicon substrate;
etching the silicon wafer to form a porous template having a predetermined configuration by current-modulated electrochemical etching process that is controlled buy a predetermined waveform to map a predetermined porosity-depth profile in the porous silicon template;
infusing a biodegradable polymer on the template; and
dissolving the template to obtain the polymer nanostructure.

* * * * *

UNITED STATES PATENT AND TRADEMARK OFFICE
CERTIFICATE OF CORRECTION

PATENT NO. : 7,713,778 B2
APPLICATION NO. : 10/544801
DATED : May 11, 2010
INVENTOR(S) : Yang Yang Li et al.

Page 1 of 1

It is certified that error appears in the above-identified patent and that said Letters Patent is hereby corrected as shown below:

On the Title Page, Item (73)

Please add an Assignee and insert --The Regents of the University of California, Oakland, CA (U.S.)--.

| | |
|---|---|
| Col. 1, line 8 | Please delete "60,447,228" and insert --60/447,228-- therefor. |
| Col. 4, line 20 | Please delete "$Sio_2$ and insert --$SiO_2$-- therefor. |
| Col. 8, line 53 Claim 30 | Please insert --a-- between "by" and "current-modulated". |
| Col. 8, line 54 Claim 30 | Please delete "buy" and insert --by-- therefor. |

Signed and Sealed this
Twenty-seventh Day of September, 2011

David J. Kappos
*Director of the United States Patent and Trademark Office*